(12) United States Patent
Matsushita et al.

(10) Patent No.: US 12,527,222 B2
(45) Date of Patent: Jan. 13, 2026

(54) ULTRASONIC SENSOR

(71) Applicant: Murata Manufacturing Co., Ltd., Nagaokakyo (JP)

(72) Inventors: Tomoaki Matsushita, Nagaokakyo (JP); Kazuhiro Ebara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 825 days.

(21) Appl. No.: 17/886,522

(22) Filed: Aug. 12, 2022

(65) Prior Publication Data

US 2022/0393096 A1 Dec. 8, 2022

Related U.S. Application Data

(63) Continuation of application No. PCT/JP2021/001044, filed on Jan. 14, 2021.

(30) Foreign Application Priority Data

Feb. 26, 2020 (JP) ................. 2020-030254

(51) Int. Cl.
*H10N 30/30* (2023.01)
*G01H 11/08* (2006.01)
(Continued)

(52) U.S. Cl.
CPC .......... *H10N 30/302* (2023.02); *G01H 11/08* (2013.01); *G01S 7/521* (2013.01); *H10N 30/875* (2023.02); *H10N 30/877* (2023.02)

(58) Field of Classification Search
CPC .. H10N 30/302; H10N 30/875; H10N 30/877; B06B 1/0644; B06B 1/0662
(Continued)

(56) References Cited

U.S. PATENT DOCUMENTS

2007/0035212 A1* 2/2007 Straub, Jr. ............... G01F 1/662
310/348
2008/0018205 A1 1/2008 Rhim et al.
2016/0056366 A1 2/2016 Nakamura

FOREIGN PATENT DOCUMENTS

CN 103828395 A 5/2014
JP 6359499 U 4/1988
(Continued)

OTHER PUBLICATIONS

International Search Report in PCT/JP2021/001044, mailed Apr. 13, 2021, 4 pages.
(Continued)

*Primary Examiner* — Derek J Rosenau
(74) *Attorney, Agent, or Firm* — Keating & Bennett, LLP

(57) ABSTRACT

An ultrasonic sensor includes a piezoelectric body including first and second surfaces. First and second electrodes are respectively provided on the first and second surfaces. The second electrode is opposed to the first electrode with the piezoelectric body interposed therebetween. A third electrode is provided on the second surface. The third electrode is spaced apart from the second electrode. The third electrode is electrically connected to the first electrode. When viewed from a thickness direction in which the first surface and the second surface are arranged, the second electrode extends to both end edges of the second surface in a first direction and is spaced apart from both end edges of the second surface in a second direction orthogonal to the first direction.

20 Claims, 6 Drawing Sheets

(51) Int. Cl.
*G01S 7/521* (2006.01)
*H10N 30/87* (2023.01)

(58) Field of Classification Search
USPC .................................... 310/322, 334
See application file for complete search history.

(56) References Cited

FOREIGN PATENT DOCUMENTS

| | | | |
|---|---|---|---|
| JP | 07136164 A | 5/1995 | |
| JP | 07154898 A | 6/1995 | |
| JP | 2003061193 A | 2/2003 | |
| JP | 2005093541 A | 4/2005 | |
| JP | 2006093916 A | 4/2006 | |
| JP | 2008531110 A | 8/2008 | |
| KR | 20180137974 A | 12/2018 | |
| WO | 2013047544 A1 | 4/2013 | |
| WO | 2015060132 A1 | 4/2015 | |
| WO | 2016147917 A1 | 9/2016 | |
| WO | WO-2016171003 A1 * | 10/2016 | ........... G01S 15/931 |

OTHER PUBLICATIONS

Written Opinion in PCT/JP2021/001044, mailed Apr. 13, 2021, 4 pages.
Official Communication issued in corresponding Chinese Patent Application No. 202180008559.7, mailed on Oct. 11, 2024, 7 pages.

* cited by examiner

ULTRASONIC SENSOR

CROSS REFERENCE TO RELATED APPLICATIONS

This application claims the benefit of priority to Japanese Patent Application No. 2020-030254 filed on Feb. 26, 2020 and is a Continuation Application of PCT Application No. PCT/JP2021/001044 filed on Jan. 14, 2021. The entire contents of each application are hereby incorporated herein by reference.

BACKGROUND OF THE INVENTION

1. Field of the Invention

The present invention relates to an ultrasonic sensor.

2. Description of the Related Art

Japanese Unexamined Patent Application Publication No. H7-154898 and International Publication No. 2013/047544 disclose configurations of ultrasonic sensors. In addition, Japanese Unexamined Utility Model Registration Application Publication No. S63-59499 discloses a configuration of a piezoelectric element.

The ultrasonic sensor disclosed in Japanese Unexamined Patent Application Publication No. H7-154898 includes a disk-shaped acoustic matching plate and a disk-shaped piezoelectric element plate. The disk-shaped piezoelectric element plate is bonded to an upper surface of the disk-shaped acoustic matching plate. Two electrode layers are formed on the front and back surfaces of the disk-shaped piezoelectric element plate. The electrode layer located on the acoustic matching plate side includes an electric extended end. The electric extended end extends to the front surface side.

The ultrasonic sensor disclosed in International element. The case has a bottomed cylindrical shape and includes a bottom surface portion. The bottom surface portion is a vibration region. The piezoelectric element includes a piezoelectric substrate, a first electrode, a second electrode, and a third electrode. The piezoelectric substrate includes a first surface and a second surface. The second surface is opposed to the first surface. The first electrode is provided on the first surface. The first electrode is bonded to the bottom surface portion. The second electrode is provided on a portion of the second surface. The third electrode is spaced apart from the second electrode on a portion of the second surface. The third electrode is connected to the first electrode. The piezoelectric element is arranged such that a position of the center thereof is different from that of the center of the vibration region in a plan view of the bottom surface portion.

The piezoelectric element disclosed in Japanese Unexamined Utility Model Registration Application Publication No. S63-59499 includes a piezoelectric main body, a first electrode portion, a second electrode portion, and a third electrode portion. The piezoelectric main body performs longitudinal vibration in the thickness direction. The piezoelectric main body includes a first surface and a second surface that are perpendicular to a vibration direction and opposed to each other. The first electrode portion is provided on the first surface. The second electrode portion is disposed on the second surface and connected to the first electrode portion. The second electrode portion includes a lead connection portion. The third electrode portion is disposed on the second surface separately from the second electrode portion. The third electrode portion includes a lead connection portion. The lead connection portion of the second electrode portion and the lead connection portion of the third electrode portion are provided in an outer edge portion of the second surface. An outer edge shape of any one of the second electrode portion and the third electrode portion is set to be substantially the same as an outer edge shape of the first electrode portion.

The ultrasonic sensors disclosed in Japanese Unexamined Patent Application Publication No. H7-154898 and International Publication No. 2013/047544 are configured such that wiring can be directly connected to the electrodes of the piezoelectric element without interposing a member other than the piezoelectric element, such as a case.

However, in the ultrasonic sensor disclosed in Japanese Unexamined Patent Application Publication No. H7-154898, when viewed from the thickness direction of a piezoelectric body, the symmetry of the shape of a portion where two electrodes are opposed to each other with respect to the center of the entire piezoelectric element, that is, a portion forming the vibration region of the electrodes is low. For this reason, spurious vibration, which is vibration in a vibration mode of a spurious frequency different from a desired resonant frequency, occurs due to vibration of the entire piezoelectric element accompanying vibration of the vibration region of the piezoelectric element. Even when the ultrasonic sensor is designed so that a reverberation time of the vibration in the vibration mode of the resonant frequency is shortened, the ultrasonic sensor is not designed so that the reverberation time of the spurious vibration is shortened. As a result, the reverberation time of the ultrasonic sensor increases due to the reverberation of the spurious vibration, and reverberation characteristics of the ultrasonic sensor decrease.

In the ultrasonic sensor disclosed in International Publication No. 2013/047544, when viewed from the thickness direction of a piezoelectric body, the symmetry of the shape of a portion forming the vibration region of the electrode of the piezoelectric element with respect to the center of the case is high. However, similar to the piezoelectric element disclosed in Japanese Unexamined Patent Application Publication No. H7-154898, the symmetry of the shape of the electrode forming the vibration region of the piezoelectric element with respect to the center of the entire piezoelectric element is low. Therefore, it is not sufficient to suppress deterioration of the reverberation characteristics of the ultrasonic sensor.

In addition, Unexamined Utility Model Registration Application Publication No. S63-59499 discloses the piezoelectric element in which when viewed from the thickness direction of the piezoelectric body, the symmetry of the shape of a portion forming a vibration region of the electrode with respect to the center of the entire piezoelectric element is relatively high. However, an area of the portion forming the vibration region of the electrode is small with respect to the entire piezoelectric element, and the intensity of vibration of the piezoelectric element is low.

SUMMARY OF THE INVENTION

Preferred embodiments of the present invention provide ultrasonic sensors in each of which wiring is directly connected to an electrode of a piezoelectric element, and deterioration of reverberation characteristics is reduced or prevented while increasing the intensity of vibration caused by the piezoelectric element.

An ultrasonic sensor according to a preferred embodiment of the present invention includes a case and a piezoelectric element. The case includes a bottom portion and a peripheral wall portion. The piezoelectric element is disposed on the bottom portion in the case. The piezoelectric element includes a piezoelectric body, a first electrode, a second electrode, and a third electrode. The piezoelectric body includes a first surface and a second surface. The first surface is on the bottom portion side. The second surface is on a side opposite to the first surface. The first electrode is on the first surface. The second electrode is on the second surface. The second electrode is opposed to the first electrode with the piezoelectric body interposed therebetween. The third electrode is on the second surface. The third electrode is spaced apart from the second electrode. The third electrode is electrically connected to the first electrode. When viewed from a thickness direction in which the first surface and the second surface are provided, the second electrode extends to both end edges of the second surface in the first direction and is spaced apart from both end edges of the second surface in a second direction orthogonal or substantially orthogonal to the first direction.

According to preferred embodiments of the present invention, it is possible to directly connect the wiring to the electrode of the piezoelectric element, and it is possible to reduce or prevent the deterioration of the reverberation characteristics while increasing the intensity of the vibration caused by the piezoelectric element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
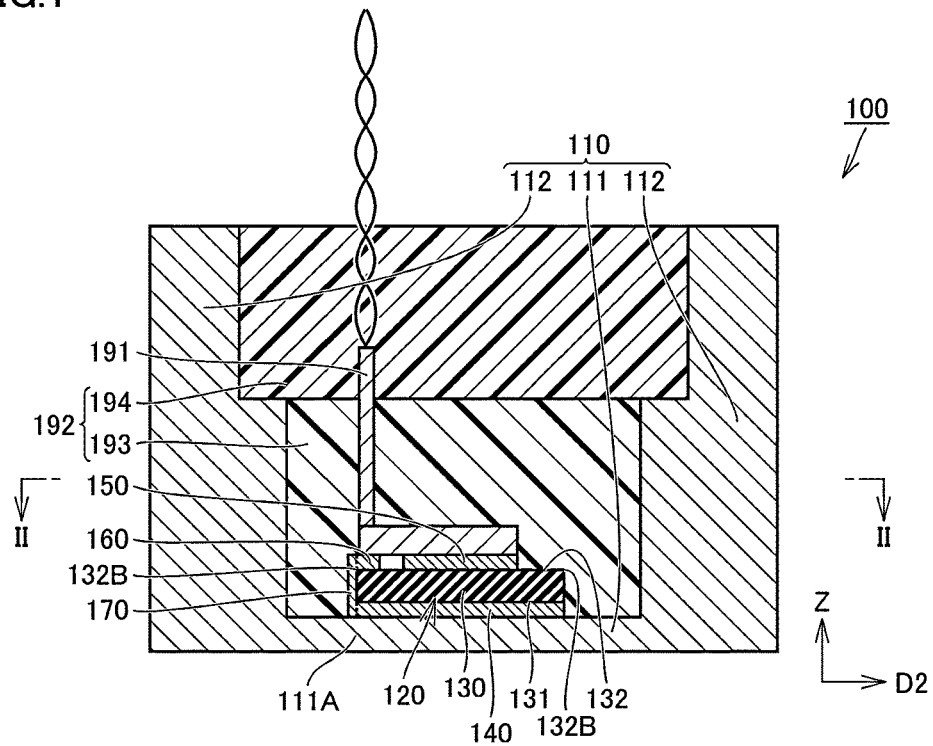
FIG. 1 is a cross-sectional view illustrating a configuration of an ultrasonic sensor according to Preferred Embodiment 1 of the present invention.

Hereinafter, ultrasonic sensors according to each preferred embodiment of the present invention will be described with reference to the drawings. In the following description of the preferred embodiments, the same or corresponding portions in the drawings are denoted by the same reference numerals, and description thereof will not be repeated.

Preferred Embodiment 1

Figure 2:
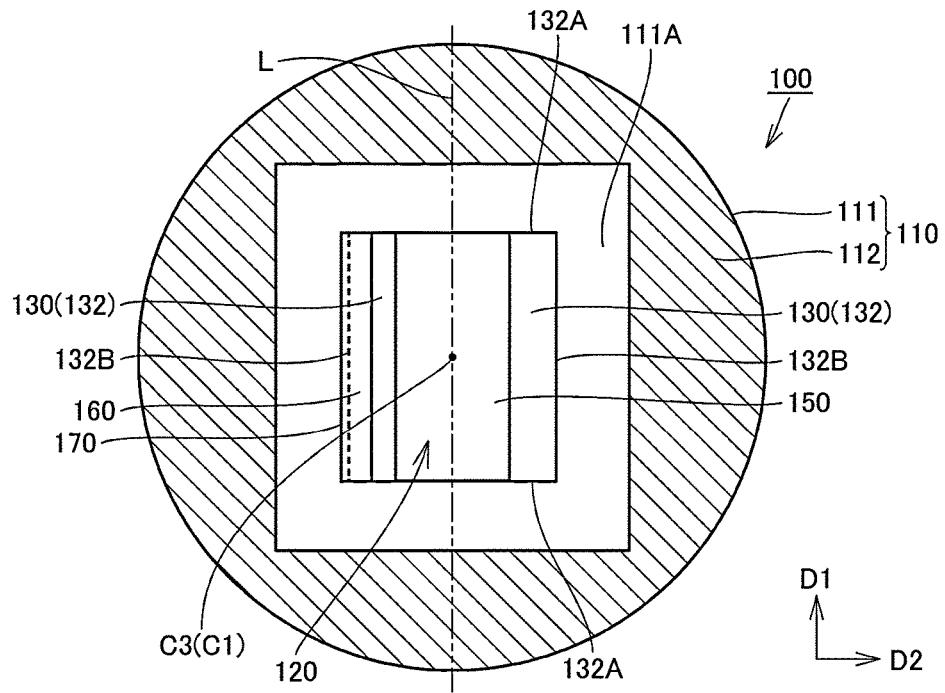
FIG. 2 is a cross-sectional view illustrating the ultrasonic sensor in FIG. 1 taken along line II-II as viewed from a direction of an arrow.

FIG. 1 is a cross-sectional view illustrating a configuration of an ultrasonic sensor according to Preferred Embodiment 1 of the present invention. FIG. 2 is a cross-sectional view of the ultrasonic sensor in FIG. 1 taken along a line II-II as viewed from a direction of an arrow. As illustrated in FIG. 1 and FIG. 2, an ultrasonic sensor 100 according to Preferred Embodiment 1 of the present invention includes a case 110 and a piezoelectric element 120.

The case 110 includes a bottom portion 111 and a peripheral wall portion 112. As illustrated in FIG. 2, when the ultrasonic sensor 100 is viewed from an opening end side located on the side opposite to the bottom portion 111 of the case 110, the entire or substantially the entire bottom portion 111 has a circular or substantially circular outer shape. A diameter of the entire bottom portion 111 when viewed from the opening end side is, for example, about 15.5 mm.

In Preferred Embodiment 1 of the present invention, when viewed from the opening end located on the side opposite to the bottom portion 111 of the case 110, a portion 111A of the bottom portion 111 facing an inside of the case has an outer shape that is line-symmetric or substantially line-symmetric with respect to, as an axis of symmetry, a virtual line passing through a center point C1 of the portion 111A and parallel or substantially parallel to a first direction D1. In addition, when viewed from the opening end, the portion 111A has an outer shape that is line-symmetric or substantially line-symmetric with respect to, as an axis of symmetry, a virtual line passing through the center point C1 and parallel to a second direction D2 orthogonal or substantially orthogonal to the first direction D1.

In Preferred Embodiment 1 of the present invention, specifically, the portion 111A of the bottom portion 111 facing the inside of the case 110 has a rectangular or substantially rectangular outer shape when viewed from the opening end side of the case 110. When viewed from the opening end side of the case 110, the outer shape of the portion 111A of the bottom portion 111 includes two long sides parallel or substantially parallel to the first direction D1 and two short sides parallel or substantially parallel to the second direction D2. The outer shape of the portion 111A of the bottom portion 111 may include two long sides parallel or substantially parallel to the second direction D2 and two short sides parallel or substantially parallel to the first direction D1.

When viewed from the opening end of the case 110, a length of the above-described portion 111A of the bottom portion 111 in the first direction D1 is, for example, about 13 mm and a length of that in the second direction D2 is, for example, about 7 mm.

In the ultrasonic sensor 100 according to Preferred Embodiment 1 of the present invention, the portion 111A of the bottom portion 111 facing the inside of the case 110 is a main vibration region of the case 110.

As illustrated in FIG. 1 and FIG. 2, when viewed from the opening direction, an area of the opening end in the peripheral wall portion 112 is larger than an area of that in the above-described portion 111A.

In Preferred Embodiment 1 of the present invention, the case 110 is made of a conductive material such as, for example, aluminum or an aluminum alloy. Note that the case 110 may be made of an insulating material, for example.

As illustrated in FIG. 2, the piezoelectric element 120 is disposed on the bottom portion 111 in the case 110. The piezoelectric element 120 is bonded onto the bottom portion 111 by an adhesive such as, for example, epoxy resin.

As illustrated in FIG. 1 and FIG. 2, the piezoelectric element 120 includes a piezoelectric body 130, a first electrode 140, a second electrode 150, and a third electrode 160.

The piezoelectric body 130 includes a first surface 131 and a second surface 132. The first surface 131 is located on the bottom portion 111 side. The second surface 132 is located on the side opposite to the first surface 131. In Preferred Embodiment 1 of the present invention, the first surface 131 and the second surface 132 are positioned parallel or substantially parallel to each other.

As illustrated in FIG. 2, when viewed from a thickness direction Z in which the first surface 131 and the second surface 132 are arranged, the piezoelectric body 130 has an outer shape that is line-symmetric or substantially line-symmetric with respect to, as an axis of symmetry, a virtual line L passing through a center point C3 of the piezoelectric body 130 and parallel or substantially parallel to the first direction D1. In addition, the piezoelectric body 130 has an outer shape that is line-symmetric or substantially line-symmetric with respect to, as an axis of symmetry, a virtual line passing through the center point C3 of the piezoelectric body 130 and parallel or substantially parallel to the second direction D2. The thickness direction Z is the same or substantially the same as the direction when the bottom portion 111 is viewed from the opening end side.

In Preferred Embodiment 1 of the present invention, specifically, the piezoelectric body 130 has a rectangular or substantially rectangular outer shape when viewed from the thickness direction Z. When viewed from the thickness direction Z, the piezoelectric body 130 includes two long sides parallel or substantially parallel to the first direction D1 and two short sides parallel or substantially parallel to the second direction D2. When viewed from the thickness direction Z, a length of the piezoelectric body 130 in the first direction D1 is, for example, about 6.5 mm and a length in the second direction D2 is, for example, equal to or more than about 5.2 mm and equal to or less than about 5.8 mm. The piezoelectric body 130 may include a long side parallel or substantially parallel to the second direction D2 and a short side parallel or substantially parallel to the first direction D1.

In Preferred Embodiment 1 of the present invention, when viewed from the thickness direction Z, the center point C3 of the piezoelectric body 130 and the center point C1 of the portion 111A of the bottom portion 111 facing the inside of the case 110 coincide with each other.

Figure 3:
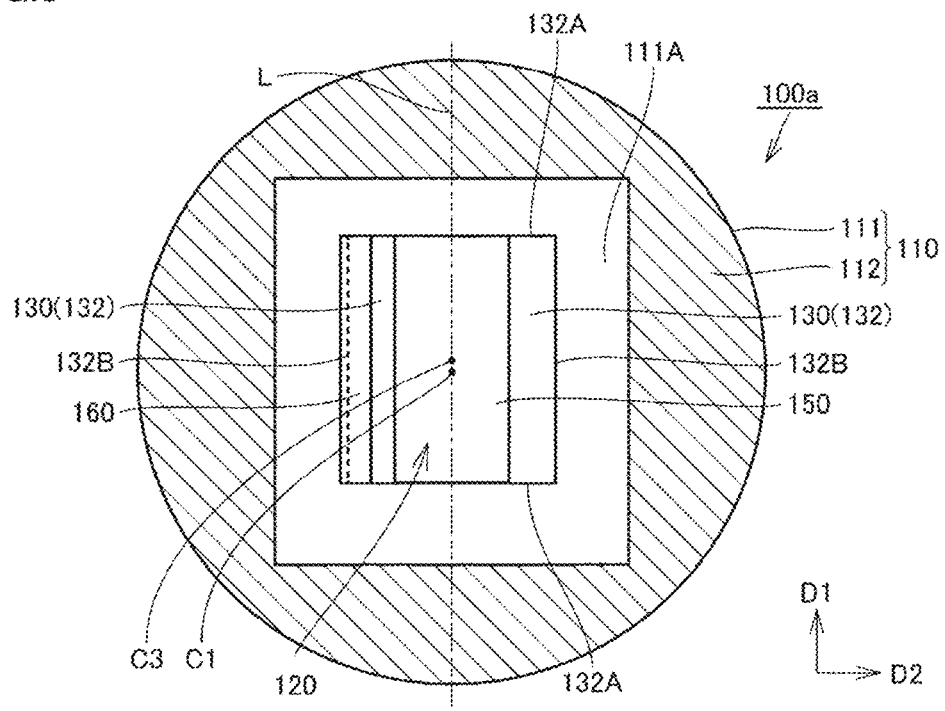
FIG. 3 is a cross-sectional view illustrating a configuration of an ultrasonic sensor according to a modification of Preferred Embodiment 1 of the present invention.

In Preferred Embodiment 1 of the present invention, when viewed from the thickness direction Z, the center point C3 of the piezoelectric body 130 and the center point C1 of the portion 111A of the bottom portion 111 facing the inside of the case do not necessarily coincide with each other. FIG. 3 is a cross-sectional view illustrating a configuration of an ultrasonic sensor according to a modification of Preferred Embodiment 1 of the present invention. FIG. 3 is the cross-sectional view the same as or similar to that of the ultrasonic sensor 100 according to Preferred Embodiment 1 of the present invention illustrated in FIG. 2.

As illustrated in FIG. 3, in an ultrasonic sensor 100a according to the modification of Preferred Embodiment 1 of the present invention, the center point C3 of the piezoelectric body 130 is positioned away from the center point C1 of the portion 111A of the bottom portion 111 facing the inside of the case 110 in the first direction D1 when viewed from the thickness direction Z. Other configurations of the ultrasonic sensor 100a according to the modification of Preferred Embodiment 1 of the present invention are the same or substantially the same as those of the ultrasonic sensor 100 according to Preferred Embodiment 1 of the present invention.

In the ultrasonic sensor 100 according to Preferred Embodiment 1 of the present invention, the piezoelectric body 130 is made of, for example, lead zirconate titanate (PZT).

As illustrated in FIG. 1, the first electrode 140 is provided on the first surface 131. In Preferred Embodiment 1 of the present invention, the first electrode 140 is provided on the entire or substantially the entire first surface 131. That is, the first electrode 140 has an outer shape the same as or similar to that of the piezoelectric body 130 when viewed from the thickness direction Z. Note that the first electrode 140 may be spaced away from at least one of both end edges of the first surface 131 in the second direction D2.

In Preferred Embodiment 1 of the present invention, the first electrode 140 is electrically connected to the bottom portion 111 via an adhesive to bond the piezoelectric element 120 to the bottom portion 111. Note that the first electrode 140 need not be electrically connected to the bottom portion 111.

As illustrated in FIG. 1, the second electrode 150 is provided on the second surface 132. The second electrode 150 is opposed to the first electrode 140 with the piezoelectric body 130 interposed therebetween.

As illustrated in FIG. 2, the second electrode 150 extends to both end edges 132A of the second surface 132 in the first direction D1 when viewed from the thickness direction Z. Accordingly, an area of a region of the second electrode 150 that is opposed to the first electrode 140 is increased, so that the vibration intensity of the piezoelectric element 120 can be increased. When viewed from the thickness direction Z, the second electrode 150 is spaced apart from both end edges 132B of the second surface 132 in the second direction D2 orthogonal or substantially orthogonal to the first direction D1. A separation distance between the second electrode 150 and both the end edges 132B is, for example, about 1.3 mm.

In Preferred Embodiment 1 of the present invention, when viewed from the thickness direction Z, the second electrode 150 has an outer shape that is line-symmetric or substantially line-symmetric with respect to, as an axis of symmetry, the virtual line L parallel or substantially parallel to the first direction D1 and passing through the center point C3 of the piezoelectric body 130. In addition, when viewed from the thickness direction Z, the second electrode 150 has an outer shape that is line-symmetric or substantially line-symmetric with respect to, as an axis of symmetry, a virtual line parallel to the second direction D2 and passing through the center point C3 of the piezoelectric body 130.

In Preferred Embodiment 1 of the present invention, when viewed from the thickness direction Z, specifically, the second electrode 150 has a rectangular or substantially rectangular outer shape. When viewed from the thickness direction Z, the second electrode 150 includes two sides parallel or substantially parallel to the first direction D1 and two sides parallel or substantially parallel to the second direction D2.

As illustrated in FIG. 1 and FIG. 2, the third electrode 160 is provided on the second surface 132. The third electrode 160 is spaced apart from the second electrode 150. The third electrode 160 is located on one side of the second electrode 150 in the second direction D2. When viewed from the thickness direction Z, the third electrode 160 extends to reach the end edge 132B located near the third electrode 160 of both the end edges 132B of the second surface 132 in the second direction D2. When viewed from the thickness direction Z, the third electrode 160 extends to both the end edges 132A of the second surface 132 in the first direction D1.

In Preferred Embodiment 1 of the present invention, the third electrode 160 has a rectangular or substantially rectangular outer shape when viewed from the thickness direction. When viewed from the thickness direction Z, the third electrode 160 includes two sides parallel or substantially parallel to the first direction D1 and two sides parallel or substantially parallel to the second direction D2.

The third electrode 160 is electrically connected to the first electrode 140. Specifically, the piezoelectric element 120 further includes a connection electrode 170, and the third electrode 160 is connected to the first electrode 140 via the connection electrode 170.

The position at which the connection electrode 170 is provided is not particularly limited as long as the connection electrode 170 is spaced apart from the second electrode 150 on the piezoelectric body 130. In Preferred Embodiment 1 of the present invention, the connection electrode 170 is provided on the side surface of the piezoelectric body 130 on the side where the third electrode 160 is located when viewed from the center point C3 of the piezoelectric body 130.

As illustrated in FIG. 1, in Preferred Embodiment 1 of the present invention, the ultrasonic sensor includes a conductive member 191 and a filling member 192. Note that in FIG. 2, the conductive member 191 and the filling member 192 are not illustrated.

Specifically, the conductive member 191 includes a flexible printed circuit board (FPC) including a resin sheet and wiring, and two wiring portions connected to the FPC. The conductive member 191 is disposed so as to extend from the inside of the case 110 to the outside of the case 110 through the opening end of the case 110. In the case 110, one of the two wiring portions of the conductive member 191 is connected to the second electrode 150 via the FPC, and the other of the two wiring portions is connected to the third electrode 160.

The filling member 192 fills all or a portion of a gap between other members inside the case 110. In Preferred Embodiment 1 of the present invention, the filling member 192 includes a first filling member 193 and a second filling member 194 which have different expansion ratios from each other, the second filling member 194 being located closer to the opening end side of the case 110 with respect to the first filling member 193. Note that the filling member 192 may have the same or substantially the same expansion ratio as a whole. The filling member 192 is made of, for example, silicone foam.

A mechanism of transmission and reception of ultrasonic waves of the ultrasonic sensor 100 according to Preferred Embodiment 1 of the present invention will be briefly described. First, when ultrasonic waves are transmitted using the ultrasonic sensor 100, a pulse voltage is applied between the first electrode 140 and the third electrode 160 via the conductive member 191, so that a pulse voltage is applied between the first electrode 140 and the second electrode 150 connected to the third electrode 160. When a pulse voltage is applied between the first electrode 140 and the second electrode 150, electric charges in the piezoelectric body 130 located between the first electrode 140 and the second electrode 150 attract or repel external electric charges. Accordingly, the piezoelectric body 130 repeats expansion and contraction. As the piezoelectric body 130 repeats expansion and contraction, the piezoelectric element 120 vibrates. When the piezoelectric element 120 vibrates, the above-described portion 111A of the bottom portion 111 bonded to the piezoelectric element 120 mainly vibrates. As a result, ultrasonic waves are transmitted from the bottom portion 111.

When ultrasonic waves are received using the ultrasonic sensor 100, the portion 111A of the bottom portion 111 vibrates due to the ultrasonic waves that hit the portion 111A of the bottom portion 111. When the portion 111A vibrates, the piezoelectric element 120 vibrates and the piezoelectric body 130 repeats expansion and contraction. As the piezoelectric body 130 repeats expansion and contraction, electric charges opposite to each other are generated on the first surface 131 and the second surface 132. Accordingly, a voltage is applied between the first electrode 140 and the second electrode 150. A voltage between the first electrode 140 and the third electrode 160 connected to the second electrode 150 is detected via the conductive member 191. In this manner, ultrasonic waves can be received using the ultrasonic sensor 100.

In the ultrasonic sensor 100, the time from when the voltage application to each electrode is stopped to when the vibrations of the piezoelectric element 120 and the case 110 are stopped is a reverberation time. In a case where an ultrasonic wave transmitted using the ultrasonic sensor 100 is reflected by an object and then the reflected ultrasonic wave is received using the same ultrasonic sensor 100, the reverberation time after the transmission of the ultrasonic wave is important. This is because when the object is located near the ultrasonic sensor 100, the time from transmission to reception of ultrasonic waves is relatively short, and thus the reception sensitivity of the ultrasonic sensor 100 is improved as the reverberation time becomes shorter.

Hereinafter, a first experimental example of the ultrasonic sensor 100 according to Preferred Embodiment 1 of the present invention will be described. In the first experimental example, ultrasonic sensors according to Example 1, Example 2, Comparative Example 1, and Comparative Example 2 were produced.

The ultrasonic sensor according to Example 1 had the same or substantially the same configuration as that of the ultrasonic sensor 100 according to Preferred Embodiment 1 of the present invention, and further, the length of the piezoelectric body 130 in the first direction D1 when viewed from the thickness direction Z was set to about 6.5 mm and the length of the piezoelectric body 130 in the second direction D2 was set to about 5.8 mm. In addition, a separation distance between the second electrode 150 and the end edge 132B on the third electrode 160 side of both the end edges 132B in the second direction D2 when viewed from the thickness direction Z was set to about 1.3 mm, a diameter of the bottom portion 111 when viewed from the thickness direction Z was set to about 15.5 mm, a length of the portion 111A of the bottom portion 111 facing the inside of the case 110 in the first direction D1 was set to about 13 mm, and a length of the portion 111A in the second direction D2 was set to about 7 mm. Specifically, in the ultrasonic sensor according to Example 1, the case 110 was made of aluminum, and the piezoelectric body was made of PZT. The piezoelectric element 120 was bonded onto the bottom portion 111 of the case 110 using, for example, an epoxy resin.

The ultrasonic sensor according to Example 2 had the same or substantially the same configuration as the ultrasonic sensor 100a according to the first modification of Preferred Embodiment 1 of the present invention, and further, the piezoelectric element 120 was disposed such that the center point C3 of the piezoelectric body 130 was about 0.3 mm away from the center point C1 of the portion 111A of the bottom portion 111 facing the inside of the case 110 toward the third electrode side in the second direction D2. A material forming the case 110, a material of the piezoelectric body 130, and a method of bonding the piezoelectric element 120 onto the bottom portion 111 of the case 110 are the same as or similar to those of the ultrasonic sensor according to Example 1.

Figure 4:
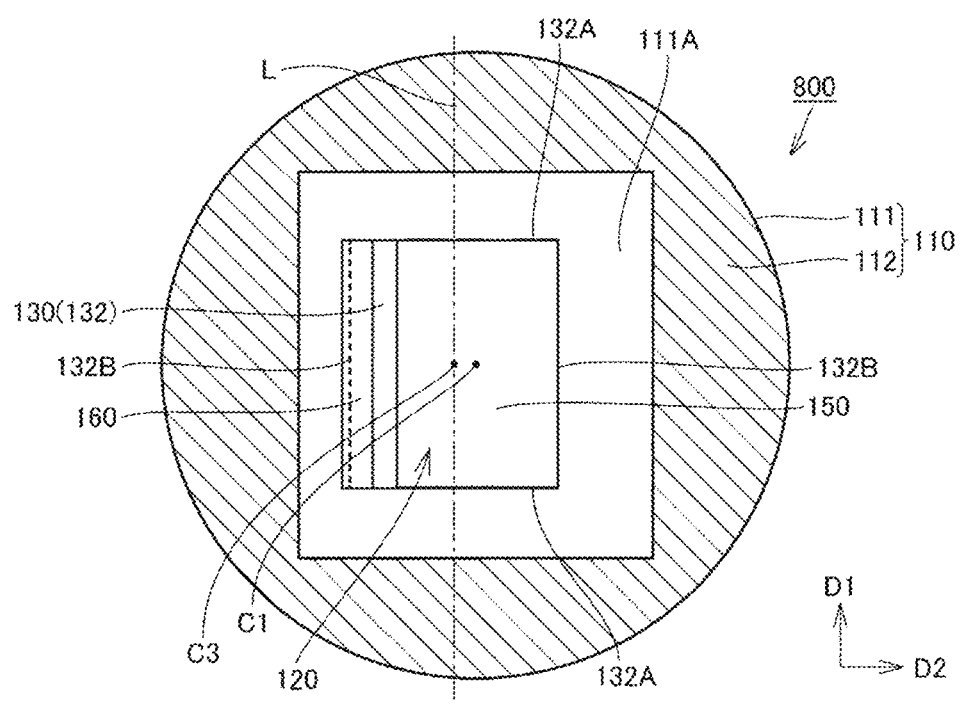
FIG. 4 is a cross-sectional view illustrating a configuration of an ultrasonic sensor according to Comparative Example 1.

The ultrasonic sensor according to Comparative Example 1 is different from the ultrasonic sensor according to Example 1 only in the configuration of the second electrode and the arrangement position of the piezoelectric element. FIG. 4 is a cross-sectional view illustrating the configuration of the ultrasonic sensor according to Comparative Example 1. FIG. 4 is the cross-sectional view similar to that of the ultrasonic sensor 100 according to Preferred Embodiment 1 of the present invention illustrated in FIG. 2.

As illustrated in FIG. 4, in an ultrasonic sensor 800 according to Comparative Example 1, when viewed from the thickness direction Z, the second electrode 150 extends to the end edge 132B of the second surface 132 on the side opposite to the third electrode 160 side of both the end edges 132B of the second surface 132 in the second direction D2. In addition, in the ultrasonic sensor 800 according to Comparative Example 1, when viewed from the thickness direction Z, the piezoelectric element 120 is disposed at a position where the center of the second electrode 150 coincides or substantially coincides with the center point C1 of the portion 111A of the bottom portion 111 facing the inside of the case 110. Therefore, the center point C3 of the piezoelectric body 130 is positioned about 0.3 mm away from the center point C1 of the portion 111A of the bottom portion 111 facing the inside of the case 110 toward the third electrode 160 side in the second direction D2.

Figure 5:
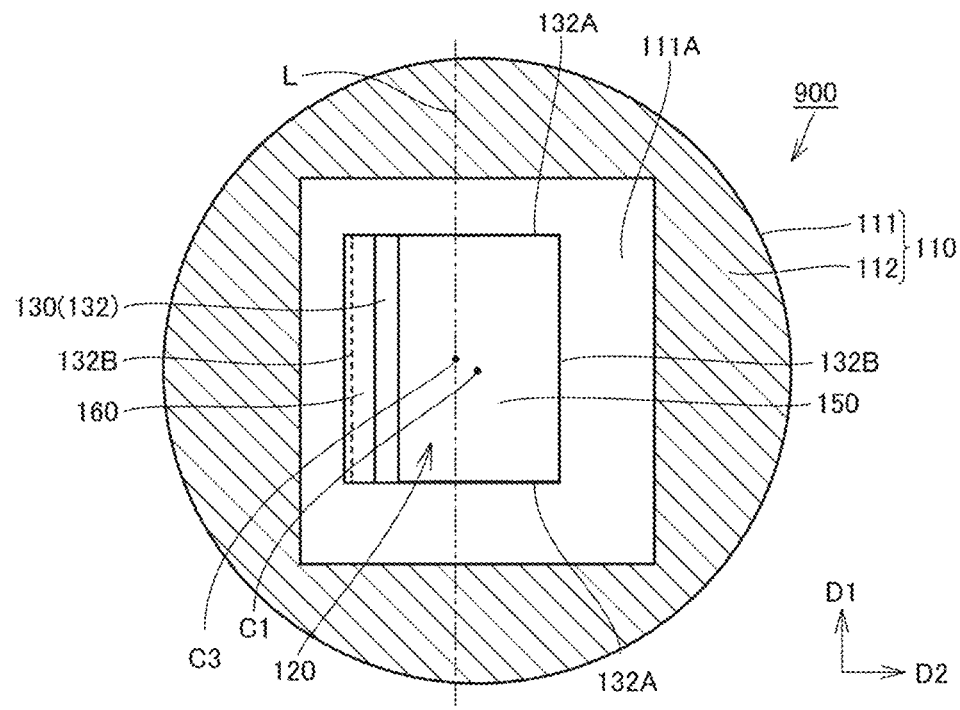
FIG. 5 is a cross-sectional view illustrating a configuration of an ultrasonic sensor according to Comparative Example 2.

The ultrasonic sensor according to Comparative Example is different from the ultrasonic sensor 800 according to Comparative Example 1 only in the arrangement position of the piezoelectric element. FIG. 5 is a cross-sectional view illustrating the configuration of the ultrasonic sensor according to Comparative Example 2. FIG. 5 is the cross-sectional view similar to that of the ultrasonic sensor 800 according to Comparative Example 1 illustrated in FIG. 4.

As illustrated in FIG. 5, in an ultrasonic sensor 900 according to Comparative Example 2, the center point C3 of the piezoelectric body 130 is positioned about 0.3 mm away from the center point C1 of the portion 111A of the bottom portion 111 facing the inside of the case 110 toward the third electrode 160 side in the second direction D2 and is positioned about 0.2 mm away toward one side in the first direction D1.

For each of the ultrasonic sensors according to Example 1, Example 2, Comparative Example 1, and Comparative Example 2, a voltage was applied between the first electrode and the third electrode connected to the second electrode, and impedance was measured. The impedance was measured using an impedance analyzer (Keysight 4194A, manufactured by Keysight Technologies). In measurement of the impedance, the impedance was measured by applying a constant voltage while a power supply frequency is continuously changed. FIG. 6 to FIG. 9 illustrate impedance curves, which are measurement results of the impedance with respect to the power supply frequency, for respective examples and respective comparative examples.

Figure 6:
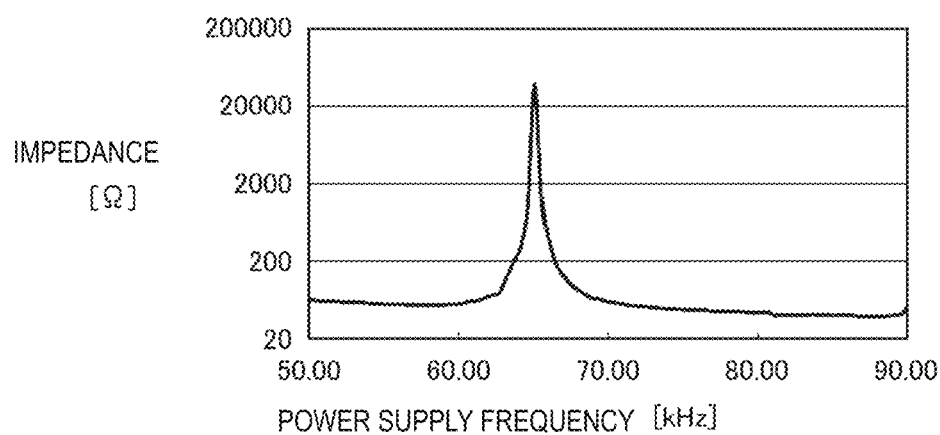
FIG. 6 is a graph illustrating an impedance curve obtained by measuring the impedance of an ultrasonic sensor according to Example 1 of a preferred embodiment of the present invention.
Figure 7:
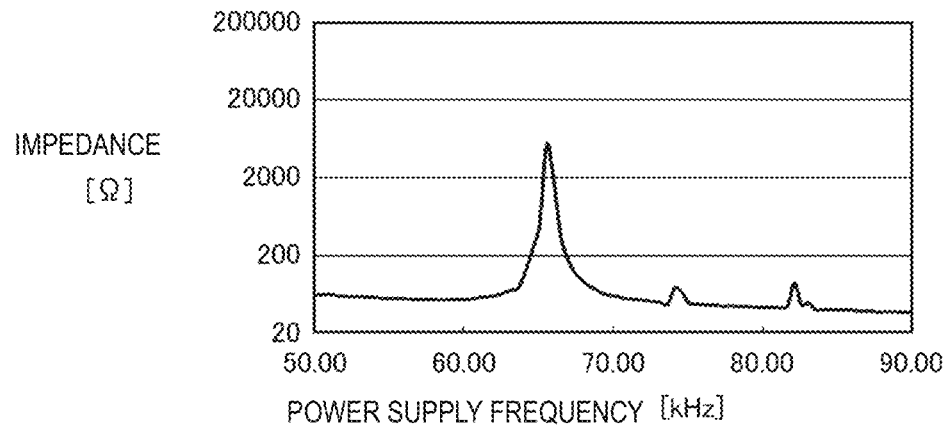
FIG. 7 is a graph illustrating an impedance curve obtained by measuring the impedance of an ultrasonic sensor according to Example 2 of a preferred embodiment of the present invention.
Figure 8:
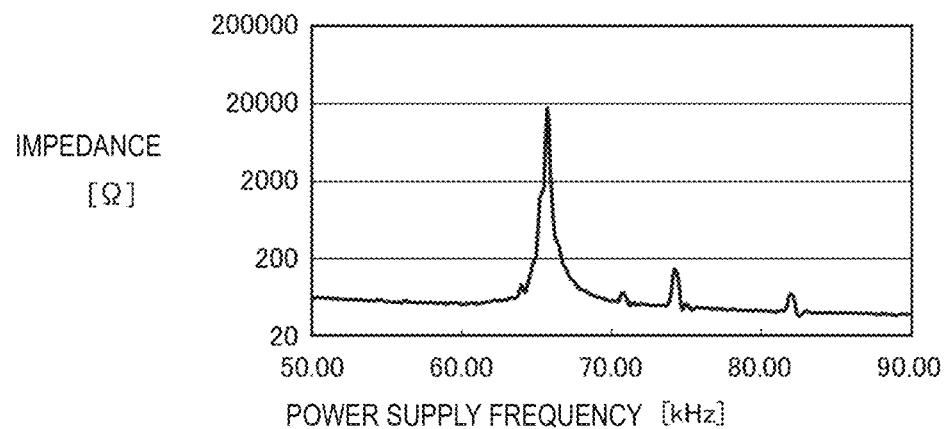
FIG. 8 is a graph illustrating an impedance curve obtained by measuring the impedance of the ultrasonic sensor according to Comparative Example 1.
Figure 9:
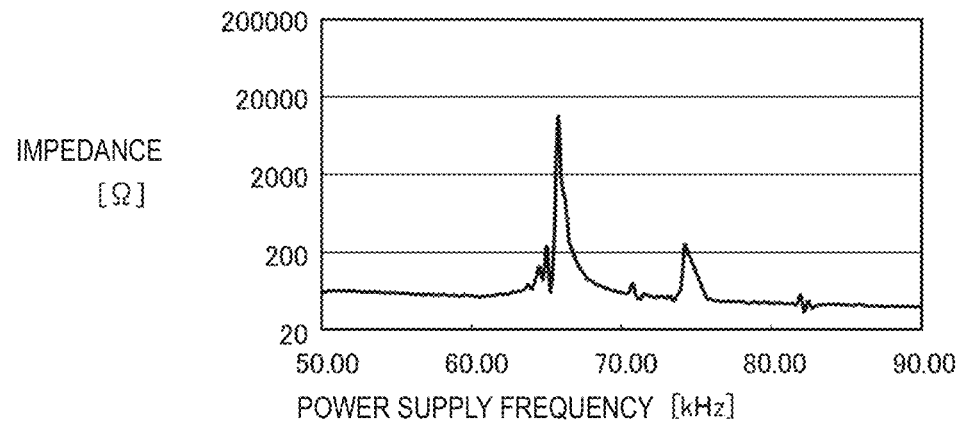
FIG. 9 is a graph illustrating an impedance curve obtained by measuring the impedance of the ultrasonic sensor according to Comparative Example 2.

FIG. 6 is a graph illustrating an impedance curve obtained by measuring the impedance of the ultrasonic sensor according to Example 1. FIG. 7 is a graph illustrating an impedance curve obtained by measuring the impedance of the ultrasonic sensor according to Example 2. FIG. 8 is a graph illustrating an impedance curve obtained by measuring the impedance of the ultrasonic sensor according to Comparative Example 1. FIG. 9 is a graph illustrating an impedance curve obtained by measuring the impedance of the ultrasonic sensor according to Comparative Example 2.

As illustrated in FIG. 6 to FIG. 9, the ultrasonic sensor according to each of the examples and the comparative examples exhibits high impedance of equal to or more than about 2000 Ω when the power supply frequency is near 65 kHz. That is, in each of the examples and comparative examples, the structure of the ultrasonic sensor is designed so that the resonant frequency is close to 65 kHz. For this reason, these ultrasonic sensors are designed so that the reverberation time is shortened when transmitting ultrasonic waves with frequencies near 65 kHz.

As illustrated in FIG. 8 and FIG. 9, in the ultrasonic sensor 800 according to Comparative Example 1 and the ultrasonic sensor 900 according to Comparative Example 2, the impedance value is about 200 Ω when the power supply frequency is near 75 kHz. For this reason, in Comparative Example 1 and Comparative Example 2, when the ultrasonic sensor vibrates at the frequency near 65 kHz, the spurious vibrations that vibrate relatively largely at the frequency near 75 kHz occur. As a result, when the ultrasonic sensor transmits ultrasonic waves having frequencies near 65 kHz, reverberation vibration of the ultrasonic sensor is mixed with the spurious vibration to cause a beat, and the reverberation time becomes longer.

On the other hand, as illustrated in FIG. 6 and FIG. 7, the ultrasonic sensors according to Example 1 and Example 2 do not have the power supply frequency at which the impedance value is about 200 Ω in a range of frequencies different from the range near 65 kHz. That is, in Example 1 and Example 2, large spurious vibrations do not occur when the ultrasonic sensor vibrates at the frequency near 65 kHz. Therefore, the spurious vibration mixed in the reverberation vibration of the ultrasonic sensor is also reduced, and the reverberation time is shortened.

In addition, as illustrated in FIG. 6 and FIG. 8, from a comparison of Example 1 and Comparative Example 1 in which the positions of the centers of the second electrodes 150 coincide or substantially coincide with each other, it can be seen that the occurrence of spurious vibration at the frequency near 75 kHz is reduced in Example 1 as compared to Comparative Example 1.

Further, as illustrated in FIG. 7 and FIG. 9, from a comparison of Example 2 and Comparative Example 2 in which the positions of the centers of the second electrodes 150 coincide or substantially coincide with each other, it can be seen that the occurrence of spurious vibration at the frequency near 75 kHz is reduced in Example 2 as compared to Comparative Example 2. As described above, in Example 2, although the position of the center point C3 of the piezoelectric body 130 in the first direction D1 does not coincide with the center point C1, since the symmetry of the second electrode 150 with respect to the entire or substantially the entire piezoelectric element 120 is improved, the occurrence of spurious frequencies can be reduced in the ultrasonic sensor according to Example 2.

Further, as illustrated in FIG. 6 and FIG. 7, in comparison of Example 1 and Example 2 are compared with each other, the impedance at the frequency near 75 kHz is further reduced in Example 1. In this way, by making the position of the center point C3 of the piezoelectric body 130 coincide with the above-described center point C1, spurious vibrations at frequencies near 75 kHz can be further reduced, and the reverberation time can be further reduced.

Next, a second experimental example of the ultrasonic sensor 100 according to Preferred Embodiment 1 of the present invention will be described. In the second experimental example, for each of the ultrasonic sensors according to Examples 3 to 8 and Comparative Examples 3 and 4, a change in spurious vibration intensity was analyzed by simulation when the separation distance between the second electrode 150 and the end edge 132B on the side opposite to the third electrode 160 of both the end edges 132B of the second surface 132 in the second direction D2 was changed. Specifically, the spurious vibration intensity was measured by piezoelectric resonance analysis based on finite element analysis simulation.

Each of the ultrasonic sensors according to Examples 3 to 5 had the same or substantially the same configuration as that of the ultrasonic sensor 100 according to Preferred Embodiment 1 of the present invention, and further, the length of the piezoelectric body 130 in the first direction D1 when viewed from the thickness direction Z was set to about 6.5 mm and the length of the piezoelectric body 130 in the second direction D2 was set to about 5.8 mm. In addition, the separation distance between the second electrode 150 and the end edge 132B on the third electrode 160 side of both the end edges 132B in the second direction D2 when viewed from the thickness direction Z was set to about 1.3 mm, the diameter of the bottom portion 111 was set to about 15.5 mm, the length of a portion of the bottom portion 111 facing the inside of the case 110 in the first direction was set to about 13 mm, and the length of the portion in the second direction was set to about 7 mm. In addition, the case 110 was made of, for example, aluminum, and the piezoelectric body was made of, for example, PZT. The piezoelectric element 120 is bonded onto the bottom portion 111 of the case 110 using, for example, an epoxy resin.

When viewed from the thickness direction Z, the separation distance between the second electrode 150 and the end edge 132B on the side opposite to the third electrode 160 of both the end edges 132B in the second direction D2 was set to about 1 mm in Example 3, about 1.3 mm in Example 4, and about 1.8 mm in Example 5.

In each of the ultrasonic sensors according to Examples 6 to 8, the length of the piezoelectric body 130 in the second direction D2 when viewed from the thickness direction Z was set to about 5.2 mm. The other configurations of Examples 6 to 8 were the same as those of Examples 3 to 5.

In the ultrasonic sensor according to Comparative Example 3, when viewed from the thickness direction Z, the second electrode extended to an end edge on the side opposite to the third electrode side of both end edges of the piezoelectric body in the second direction, and other configurations were the same or substantially the same as those of Examples 3 to 5.

In the ultrasonic sensor according to Comparative Example 4, when viewed from the thickness direction Z, the second electrode extended to an end edge on the side opposite to the third electrode of both end edges of the piezoelectric body in the second direction, and other configurations were the same or substantially the same as those of Examples 6 to 8.

Table 1 below shows a ratio of the spurious vibration intensity at the frequency of about 72 kHz of each of the ultrasonic sensors according to Examples 3 to 5 with respect to an amplitude intensity (magnitude of amplitude) of the spurious vibration at the frequency of about 72 kHz of the ultrasonic sensor according to Comparative Example 3 measured by the above-described simulation. In addition, Table 2 below shows a ratio of the spurious vibration intensity at the frequency of 72 kHz of each of the ultrasonic sensors according to Examples 6 to 8 with respect to the spurious vibration intensity at the frequency of 72 kHz of the ultrasonic sensor according to Comparative Example 4 measured by the above-described simulation.

TABLE 1

|  | Comparative Example 3 | Example 3 | Example 4 | Example 5 |
|---|---|---|---|---|
| Separation distance between second electrode and end edge [mm] | 0 | 1 | 1.3 | 1.8 |
| Vibration intensity ratio | 1 | 0.6 | 0.2 | 0.6 |

TABLE 2

|  | Comparative Example 4 | Example 6 | Example 7 | Example 8 |
|---|---|---|---|---|
| Separation distance between second electrode and end edge [mm] | 0 | 1 | 1.3 | 1.8 |
| Vibration intensity ratio | 1 | 0.7 | 0.1 | 0.6 |

As shown in above Table 1, in Examples 3 to 5, the vibration intensity ratio was small as the separation distance between the second electrode 150 and the end edge 132B on the side opposite to the third electrode 160 of both the end edges 132B in the second direction D2 when viewed from the thickness direction Z was closer to about 1.3 mm, that is, it can be seen that the spurious vibration is reduced as the above-described separation distance is closer to about 1.3 mm. Here, in Examples 3 to 5, the separation distance between the second electrode 150 and the end edge 132B on the third electrode 160 side of both the end edges 132B in the second direction D2 when viewed from the thickness direction Z is about 1.3 mm. Therefore, it is understood that the higher the symmetry of the second electrode 150 in the second direction D2 on the piezoelectric body 130 is, the smaller the spurious vibration is. Furthermore, as in Example 4, it is understood that when the separation distances between the second electrode 150 and both the end edges 132B in the second direction D2 are equal to each other, the spurious vibration is minimized. Also in Examples 6 to 8 in above Table 2, the same or substantially the same tendency as in Examples 3 to 5 is shown.

As described above, the ultrasonic sensor 100 according to Preferred Embodiment 1 of the present invention includes the case 110 and the piezoelectric element 120. The case 110 includes the bottom portion 111 and the peripheral wall portion 112. The piezoelectric element 120 is disposed on the bottom portion 111 in the case 110. The piezoelectric element 120 includes the piezoelectric body 130, the first electrode 140, the second electrode 150, and the third electrode 160. The piezoelectric body 130 has the first surface 131 and the second surface 132. The first surface 131 is located on the bottom portion 111 side. The second surface 132 is located on the side opposite to the first surface 131. The first electrode 140 is provided on the first surface 131. The second electrode 150 is provided on the second surface 132. The second electrode 150 is opposed to the first electrode 140 with the piezoelectric body 130 interposed therebetween. The third electrode 160 is provided on the second surface 132. The third electrode 160 is spaced apart from the second electrode 150. The third electrode 160 is electrically connected to the first electrode 140. When viewed from the thickness direction Z in which the first surface 131 and the second surface 132 are arranged, the second electrode 150 extends to both the end edges 132A of the second surface 132 in the first direction D1, and is spaced apart from both the end edges 132B of the second surface 132 in the second direction D2 orthogonal or substantially orthogonal to the first direction D1.

Accordingly, in the ultrasonic sensor 100 according to Preferred Embodiment 1 of the present invention, the wiring can be electrically connected to the first electrode 140 and the second electrode 150 without interposing a member other than the piezoelectric element 120, such as the case 110, and the intensity of vibration caused by the piezoelectric element 120 can be increased. Furthermore, when viewed from the thickness direction Z of the piezoelectric body 130, since the symmetry of the outer shape of the second electrode 150 with respect to the outer shape of the piezoelectric body 130 is improved, the spurious vibration is reduced or prevented, and it is possible to reduce or prevent deterioration of reverberation characteristics due to the reverberation of the vibration.

In Preferred Embodiment 1 of the present invention, when viewed from the thickness direction Z, the second electrode 150 has an outer shape that is line-symmetric or substantially line-symmetric with respect to, as an axis of symmetry, the virtual line L parallel to the first direction D1 and passing through the center point C3 of the piezoelectric body 130.

Accordingly, when viewed from the thickness direction Z, the symmetry of the outer shape of the second electrode 150 with respect to the outer shape of the piezoelectric body 130 is further improved, and thus it is possible to further reduce or prevent the deterioration of the reverberation characteristics of the ultrasonic sensor 100.

In Preferred Embodiment 1 of the present invention, when viewed from the thickness direction Z, the center point C3 of the piezoelectric body 130 and the center point C1 of the portion 111A of the bottom portion 111 facing the inside of the case 110 coincide or substantially coincide with each other.

Accordingly, when viewed from the thickness direction Z, since the symmetry of the outer shape of the second electrode 150 with respect to the outer shape of the portion 111A of the bottom portion 111 facing the inside of the case 110 is improved, it is possible to further reduce or prevent the deterioration of the reverberation characteristics of the ultrasonic sensor 100.

In Preferred Embodiment 1 of the present invention, the case 110 is made of a conductive material. The first electrode 140 is electrically connected to the bottom portion 111.

Thus, by connecting the case 110 to the ground potential, the first electrode 140 can be used as a ground electrode in the piezoelectric element 120.

Preferred Embodiment 2

An ultrasonic sensor according to Preferred Embodiment 2 of the present invention will be described below. The ultrasonic sensor according to Preferred Embodiment 2 of the present invention is different from the ultrasonic sensor 100 according to Preferred Embodiment 1 of the present invention in that the piezoelectric element further includes a fourth electrode. Therefore, description of the same or substantially the same configuration as that of the ultrasonic sensor 100 according to Preferred Embodiment 1 of the present invention will not be repeated.

Figure 10:
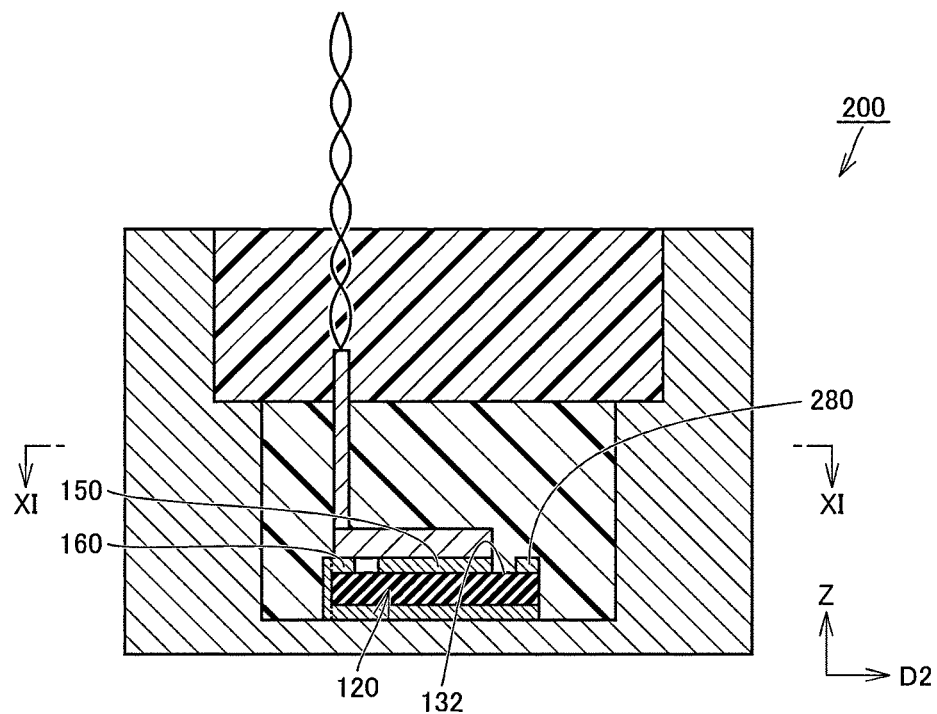
FIG. 10 is a cross-sectional view illustrating a configuration of an ultrasonic sensor according to Preferred Embodiment 2 of the present invention.
Figure 11:
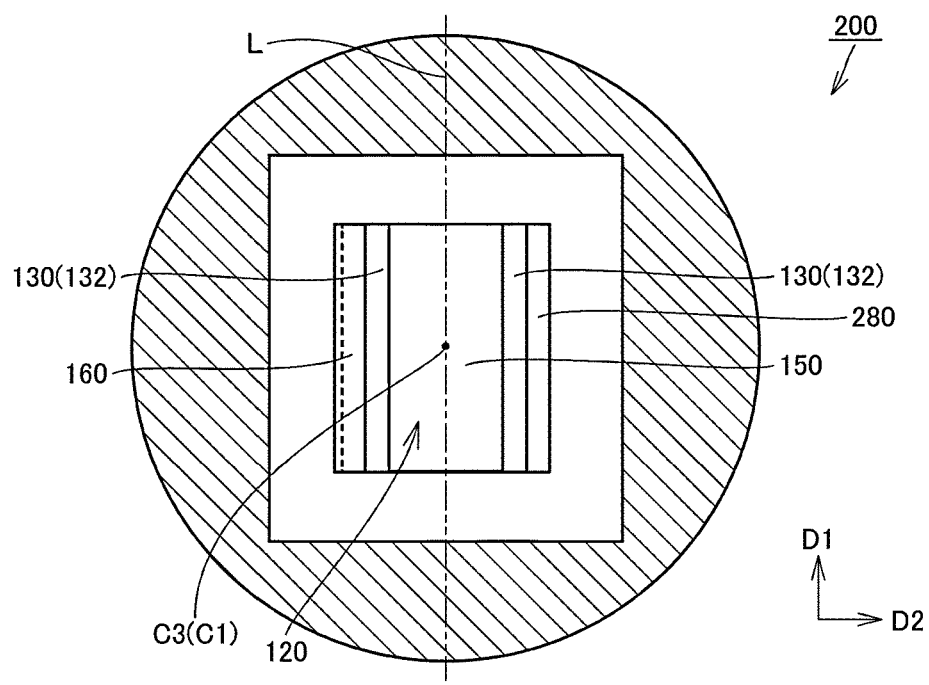
FIG. 11 is a cross-sectional view illustrating the ultrasonic sensor in FIG. 10 taken along line XI-XI as viewed from a direction of an arrow.

FIG. 10 is a cross-sectional view illustrating the configuration of the ultrasonic sensor according to Preferred Embodiment 2 of the present invention. FIG. 11 is a cross-sectional view of the ultrasonic sensor in FIG. 10 taken along a line XI-XI as viewed from a direction of an arrow. As illustrated in FIG. 10 and FIG. 11, in an ultrasonic sensor 200 according to Preferred Embodiment 2 of the present invention, the piezoelectric element 120 further includes a fourth electrode 280. When viewed from the thickness direction Z, the fourth electrode 280 is spaced apart from the second electrode 150 on the second surface 132. The fourth electrode 280 is located on the side opposite to the third electrode 160 with respect to the second electrode 150 in the second direction D2.

According to the above-described configuration, since the pair of electrodes are disposed on the second surface 132 so as to be adjacent to each other with the second electrode 150 interposed therebetween in a symmetrical or substantially symmetrical manner, an internal stress of the piezoelectric body 130 on the second surface 132 side is reduced, the occurrence of cracks in the piezoelectric body 130 is reduced or prevented, and the mechanical reliability of the ultrasonic sensor 200 can be improved.

In addition, in the ultrasonic sensor 200 according to Preferred Embodiment 2 of the present invention, specifically, when viewed from the thickness direction Z, the fourth electrode 280 has an outer shape that is line-symmetric or substantially line-symmetric to the third electrode 160 with respect to, as an axis of symmetry, the virtual line L passing through the center point C3 of the piezoelectric body 130 and parallel or substantially parallel to the first direction D1. Accordingly, the symmetry of the electrode on the second surface 132 is further improved, and the internal stress of the piezoelectric body 130 can be further reduced.

Preferred Embodiment 3

An ultrasonic sensor according to Preferred Embodiment 3 of the present invention will be described below. The ultrasonic sensor according to Preferred Embodiment 3 of the present invention is different from the ultrasonic sensor 100 according to Preferred Embodiment 1 of the present invention mainly in the outer shape of the piezoelectric element when viewed from the thickness direction. Therefore, description of the same or substantially the same configuration as that of the ultrasonic sensor 100 according to Preferred Embodiment 1 of the present invention will not be repeated.

Figure 12:
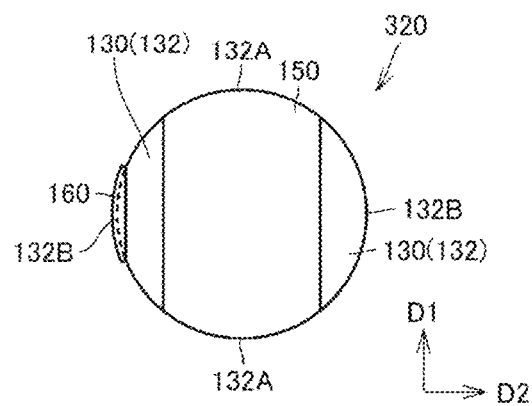
FIG. 12 is a plan view illustrating a configuration of a piezoelectric element in an ultrasonic sensor according to Preferred Embodiment 3 of the present invention.

FIG. 12 is a plan view illustrating the configuration of the piezoelectric element in the ultrasonic sensor according to Preferred Embodiment 3 of the present invention. In FIG. 12, only a piezoelectric element 320 of the ultrasonic sensor according to Preferred Embodiment 3 of the present invention is illustrated from the same direction as the piezoelectric element 120 in Preferred Embodiment 1 of the present invention illustrated in FIG. 2.

As illustrated in FIG. 12, in Preferred Embodiment 3 of the present invention, the piezoelectric element 320 has a circular or substantially circular outer shape when viewed from the thickness direction Z of the piezoelectric body 130. The piezoelectric body 130 has a circular or substantially circular outer shape when viewed from the thickness direction Z.

Also in the ultrasonic sensor according to Preferred Embodiment 3 of the present invention, the third electrode 160 is provided on the second surface 132, similar to the ultrasonic sensor 100 according to Preferred Embodiment 1 of the present invention. The third electrode 160 is spaced apart from the second electrode 150. When viewed from the thickness direction Z, the second electrode 150 extends to both the end edges 132A of the second surface 132 in the first direction D1, and is spaced apart from both the end edges 132B of the second surface 132 in the second direction D2 orthogonal or substantially orthogonal to the first direction D1. Accordingly, it is possible to connect the wiring to the electrode without interposing another member such as a case, and it is possible to reduce or prevent the deterioration of the reverberation characteristics while increasing the intensity of the vibration caused by the piezoelectric element 320.

Preferred Embodiment 4

An ultrasonic sensor according to Preferred Embodiment 4 of the present invention will be described below. The ultrasonic sensor according to Preferred Embodiment 4 of the present invention is different from the ultrasonic sensor 200 according to Preferred Embodiment 2 of the present invention mainly in the outer shape of the piezoelectric element when viewed from the thickness direction. Therefore, description of the same or substantially the same configuration as that of the ultrasonic sensor 200 according to Preferred Embodiment 2 of the present invention will not be repeated.

Figure 13:
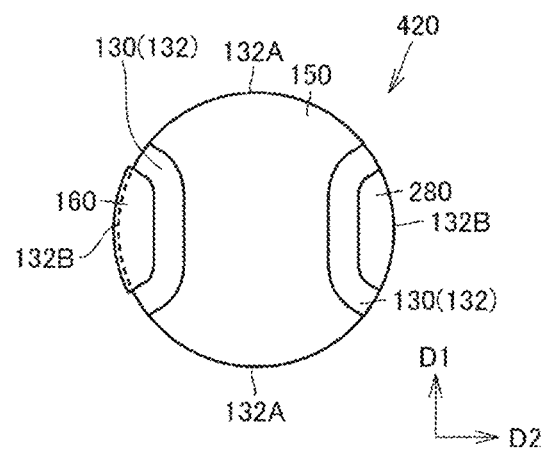
FIG. 13 is a plan view illustrating a configuration of a piezoelectric element in an ultrasonic sensor according to Preferred Embodiment 4 of the present invention.

FIG. 13 is a plan view illustrating the configuration of the piezoelectric element in the ultrasonic sensor according to Preferred Embodiment 4 of the present invention. In FIG. 13, the piezoelectric element is illustrated from the same direction as the piezoelectric element 120 in Preferred Embodiment 2 of the present invention illustrated in FIG. 11.

As illustrated in FIG. 13, in Preferred Embodiment 4 of the present invention, a piezoelectric element 420 has a circular or substantially circular outer shape when viewed from the thickness direction Z of the piezoelectric body 130. The piezoelectric body 130 has a circular or substantially circular outer shape when viewed from the thickness direction Z.

Also in the ultrasonic sensor according to Preferred Embodiment 4 of the present invention, the third electrode 160 is provided on the second surface 132, similar to the ultrasonic sensor 100 according to Preferred Embodiment 2 of the present invention. The third electrode 160 is spaced apart from the second electrode 150. When viewed from the thickness direction Z, the second electrode 150 extends to both of the end edges 132A of the second surface 132 in the first direction D1, and is spaced apart from both the end edges 132B of the second surface 132 in the second direction D2 orthogonal or substantially orthogonal to the first direction D1. Accordingly, it is possible to connect the wiring to the electrode without interposing another member such as a case, and it is possible to reduce or prevent the deterioration of the reverberation characteristics while increasing the intensity of the vibration caused by the piezoelectric element 420.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An ultrasonic sensor comprising:
   a case including a bottom portion and a peripheral wall portion; and
   a piezoelectric element on the bottom portion in the case; wherein
   the piezoelectric element includes a piezoelectric body including a first surface on a bottom portion side and a second surface on a side opposite to the first surface, a first electrode on the first surface, a second electrode on the second surface, and a third electrode on the second surface, spaced apart from the second electrode, and electrically connected to the first electrode;
   the second electrode is opposed to the first electrode with the piezoelectric body interposed between the second electrode and the first electrode; and
   when viewed from a thickness direction in which the first surface and the second surface are arranged, the second electrode extends to both end edges of the second surface in a first direction, and is spaced apart from both end edges of the second surface in a second direction orthogonal or substantially orthogonal to the first direction.
2. The ultrasonic sensor according to claim 1, wherein when viewed from the thickness direction, the second electrode has an outer shape that is line-symmetric or substantially line-symmetric with respect to, as an axis of symmetry, a virtual line parallel or substantially parallel to the first direction and passing through a center point of the piezoelectric body.
3. The ultrasonic sensor according to claim 2, wherein when viewed from the thickness direction, the center point of the piezoelectric body and a center point of a portion of the bottom portion facing an inside of the case coincide with each other.
4. The ultrasonic sensor according to claim 1, wherein the case is made of a conductive material; and
   the first electrode is electrically connected to the bottom portion.
5. The ultrasonic sensor according to claim 1, wherein when viewed from the thickness direction, the piezoelectric element further includes a fourth electrode spaced apart from the second electrode on the second surface; and
   the fourth electrode is located on a side opposite to the third electrode with respect to the second electrode in the second direction.

6. The ultrasonic sensor according to claim 1, wherein the bottom portion has a circular or substantially circular outer shape.

7. The ultrasonic sensor according to claim 6, wherein a diameter of the bottom portion is about 15.5 mm.

8. The ultrasonic sensor according to claim 1, wherein the bottom portion includes a portion facing an inside of the case having an outer shape line-symmetric or substantially line-symmetric with respect to, as an axis of symmetry, a virtual line passing through a center point of the portion facing the inside of the case and parallel or substantially parallel to the first direction.

9. The ultrasonic sensor according to claim 1, wherein the bottom portion includes a portion facing an inside of the case having a rectangular or substantially rectangular outer shape.

10. The ultrasonic sensor according to claim 9, wherein the portion facing the inside of the case has a dimension of about 13 mm in the first direction and a dimension of about 7 mm in the second direction.

11. The ultrasonic sensor according to claim 4, wherein the conductive material is aluminum or an aluminum alloy.

12. The ultrasonic sensor according to claim 1, wherein the piezoelectric element is bonded to the bottom portion by an adhesive.

13. The ultrasonic sensor according to claim 12, wherein the adhesive is epoxy resin.

14. The ultrasonic sensor according to claim 1, wherein the first surface and the second surface are parallel or substantially parallel to each other.

15. The ultrasonic sensor according to claim 1, wherein the piezoelectric body has a rectangular or substantially rectangular outer shape when viewed in the thickness direction.

16. The ultrasonic sensor according to claim 15, wherein the piezoelectric body has a dimension of about 6.5 mm in the first direction and a dimension of equal to or more than about 5.2 mm and equal to or less than about 5.8 mm in the second direction.

17. The ultrasonic sensor according to claim 1, wherein a distance between the second electrode and both end edges of the second surface is about 1.3 mm.

18. The ultrasonic sensor according to claim 1, further comprising:
   a conductive member; and
   a filling member; wherein
   the conductive member includes a flexible printed circuit board including a resin sheet and wiring; and
   the filling member fills all or a portion of a gap inside the case.

19. The ultrasonic sensor according to claim 18, wherein
   the filling member includes a first filling member and a second filling member; and
   the first filling member and the second filling member have different expansion ratios.

20. The ultrasonic sensor according to claim 18, wherein the filling member is made of silicone foam.

* * * * *